United States Patent [19]

Takeyama et al.

[11] 4,346,163
[45] Aug. 24, 1982

[54] RESIST FOR USE IN FORMING A POSITIVE PATTERN WITH A RADIATION AND PROCESS FOR FORMING A POSITIVE PATTERN WITH RADIATION

[75] Inventors: Kenichi Takeyama, Osaka; Takayoshi Morimoto, Ashiya; Kunio Hibino, Osaka, all of Japan

[73] Assignee: Matsushita Electric Industrial Co. Ltd., Osaka, Japan

[21] Appl. No.: 188,773

[22] Filed: Sep. 22, 1980

Related U.S. Application Data

[63] Continuation of Ser. No. 960,770, Nov. 15, 1978, abandoned.

[30] Foreign Application Priority Data

Nov. 17, 1977 [JP] Japan ................. 52-138574

[51] Int. Cl.³ .............................................. B05D 3/06
[52] U.S. Cl. .................... 430/280; 427/43.1
[58] Field of Search ................ 427/43.1; 430/280; 525/119

[56] References Cited

U.S. PATENT DOCUMENTS 3,914,462 10/1975 Morishita et al. ................. 427/43.1
3,943,187 3/1976 Wu ...................................... 525/119
3,981,985 9/1976 Roberts ............................. 427/273
3,984,582 10/1976 Feder et al. ......................... 427/273
4,087,569 5/1978 Hatzakis ........................... 427/43.1

Primary Examiner—John H. Newsome
Attorney, Agent, or Firm—Burgess, Ryan and Wayne

[57] ABSTRACT

1. A resist for use in forming a positive pattern with a radiation comprising a copolymer composed of methyl methacrylate and methacrylic acid and a cross-linking agent having the following general formula:

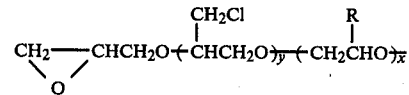

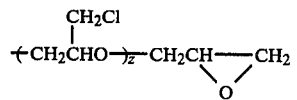

wherein R is H or CH₃, x is an integer of 1 to 9, and y and z are zero, or an integer of 1 to 3.

2. A process for forming a positive pattern on a substrate with a radiation.

2 Claims, No Drawings

RESIST FOR USE IN FORMING A POSITIVE PATTERN WITH A RADIATION AND PROCESS FOR FORMING A POSITIVE PATTERN WITH RADIATION

This is a continuation, of application Ser. No. 960,770, filed Nov. 15, 1978 now abandoned.

DESCRIPTION OF THE INVENTION

The present invention relates to a resist for use in forming a positive pattern with a radiation such as an electron beam, X-rays, a gamma-ray or deep ultraviolet rays, and to a process for forming a positive pattern on a substrate with a radiation.

The positive pattern on a substrate can be formed by using a resist which is slightly soluble in an organic solvent such as methylisobutyl ketone, but becomes readily soluble in the organic solvent after the resist has been irradiated with a radiation such as an electron beam.

As a resist for forming a positive pattern, a resist comprising polymethyl methacrylate has been disclosed in U.S. Pat. No. 3,535,137. The resist comprising polymethyl methacrylate can give a positive pattern with high resolution, but it has low sensitivity, that is, in order to remove completely the resist in the irradiated area, the irradiation amount of at least $1 \times 10^{-4}$ Coulomb/cm$^2$ is required.

It is an object of the present invention to provide a resist which has high sensitivity and can produce a positive pattern with high resolution by a small amount of irradiation such as $1 \times 10^{-6}$ Coulomb/cm$^2$ or $1 \times 10^{-5}$ Coulomb/cm$^2$.

The resist of the present invention comprises a copolymer composed of 100 moles of methyl methacrylate and 1 to 15 moles of methacrylic acid and a cross-linking agent having the following general formula (1):

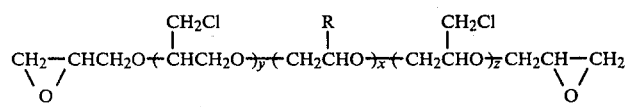

wherein R is H or CH$_3$, x is an integer of 1 to 9, and y and z are zero, or an integer of 1 to 3.

The process of the present invention for forming a pattern with a radiation comprises the steps of: (1) applying on a substrate the resist as shown above, (2) cross-linking the copolymer with the cross-linking agent by heating, (3) irradiating the desired area with a radiation and then (4) developing the latent image formed in the resist with the radiation with organic solvents.

The weight average molecular weight of the copolymers composed of methyl methacrylate and methacrylic acid is preferably 10,000 to 200,000. The resist prepared from the copolymers having the molecular weight of less than 10,000 is easily soluble in organic solvents, and the resist prepared from the copolymers having the molecular weight of more than 200,000 is insoluble in organic solvents even after it had been irradiated.

The cross-linking agents can be prepared by reacting polyethylene glycol or polypropylene glycol with epichlorohydrin as shown by the following Formula (2) and then removing HCl with NaOH from the reaction product to form epoxy groups as shown by the following Formulas (3) and (4):

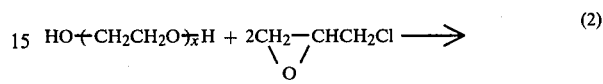

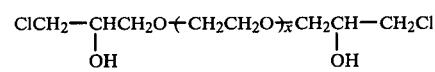

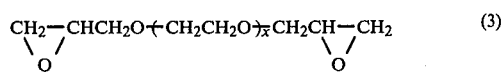

(Cross-linking agent prepared from polyethylene glycol)

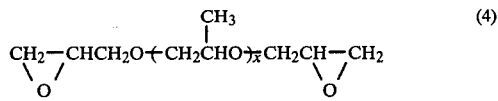

If the compound having Formula (1) in which R is H is represented by Formula E(y,x,z) and the compound having Formula (1) in which R is CH$_3$ is represented by Formula P(y,x,z), the compounds having Formulas (3) and (4) can be represented by E(0,X,0) and P(0,X,0), respectively.

In the reactions as shown above, side reactions occur and such a by-product as shown by Formula (5) is produced, and a cross-linking agent having Formula (6) can be obtained by removing HCl with NaOH.

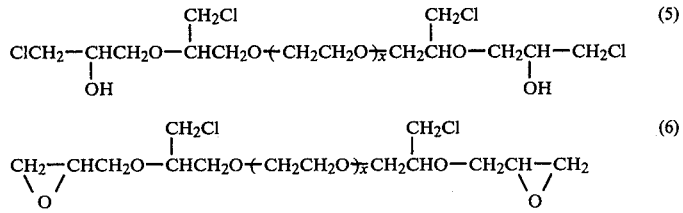

The cross-linking agent having Formula (6) can be represented by E(1,X,1).

The cross-linking agent prepared by using polypropylene glycol instead of polyethylene glycol can be represented by P(1,X,1).

In the reaction as shown above, as the amount of epichlorohydrin increases, the products having large values of y and z can be obtained. The products having different values of y and z can be isolated by gel permeation chromatography.

In the cross-linking agents represented by E(y,x,z) and P(y,x,z), x is an integer of 1 to 9, preferably 3 to 6, and y and z is zero, or an integer of 1 to 3.

Proportions of the mixture of methyl methacrylate-methacrylic acid copolymer (MMA-MAA copolymer) and cross-linking agents E(y,x,z) and/or P(y,x,z) are as follows: (1) In MMA-MAA copolymers composed of 100 parts of MMA and less than 5 parts of MAA, a ratio of the number of epoxy groups of cross-linking agents to the number of carboxylic acid groups of copolymers

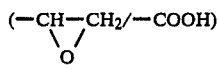

is preferably 0.5 to 3.0. (2) In MMA-MAA copolymers composed of 100 parts of MMA and more than 5 parts of MAA, the ratio mentioned above

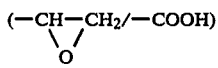

is preferably 0.1 to 2.0.

A single cross-linking agent represented by E(y,x,z) or P(y,x,z) may be used and a mixture of two or more kinds of cross-linking agents may be used.

Copolymers composed of methyl methacrylate and methacrylic acid were prepared as follows:

(1) 9 cc of methyl methacrylate (MMA), 1 cc of methacrylic acid (MAA), 5 cc of benzene and 160 mg of azobisisobutyronitrile (polymerization initiator) were mixed. The mixture was put in a sealed tube and then was subjected to radical polymerization at a temperature of 80° C. for 4 hours to obtain a copolymer (Copolymer A). This copolymer has a number average molecular weight ($\overline{Mn}$) of 31,000 and a weight average molecular weight ($\overline{Mw}$) of 88,000. The proportion of MAA to MMA of Copolymer A was 12 mole%. These molecular weights were measured by gel permeation chromatography.

(2) 9 cc of MMA, 0.4 cc of MAA, 10 cc of benzene and 160 mg of azobisisobutyronitrile were mixed. The mixture was put in a sealed tube and then was subjected to radical polymerization at a temperature of 90° C. for 3 hours to obtain a copolymer (Copolymer B). This copolymer has an Mn value of 13,000 and a Mw of 30,000. The proportion of MAA to MMA of Copolymer B was 4.5 mole%.

Cross-linking agents were prepared as follows:

96 g of epichlorohydrin was dropwise added to a mixture of 50 g of tetraethylene glycol and 0.25 ml of etherate of boron fluoride (BF$_3$) on a water bath of 40° C., while stirring and cooling the mixture to keep the temperature thereof at 44° to 45° C., and then a concentrated aqueous solution of NaOH was dropwise added to the mixture to produce epoxy groups. Sodium chloride, solvent and unchanged epichlorohydrin were removed. From the reaction products, E(0,4,0), E(1,4,0), E(1,4,1), E(2,4,0), E(2,4,1) and E(2,4,2) were isolated by gel permeation chromatography.

In the same manner, by using polypropylene glycol and epichlorohydrin, P(0,4,0), P(1,4,0), P(1,4,1), P(2,4,0), P(2,4,1) and P(2,4,2) were obtained.

A layer of the resist of the present invention can be formed on a substrate such as a silicon wafer, and a positive pattern can be obtained on the substrate as follows:

The copolymer and the cross-linking agent are dissolved in an organic solvent and insoluble matter is filtered off. The filtrate is applied on a substrate (e.g. silicon wafer) by a spin coat method and then dried off to form a film on the substrate. The film is heated at a temperature of 100° C. to 170° C. to subject to cross-linking the copolymer with the cross-linking agent. The film is scanned with an electron beam to decompose the cross-linked structure in the scanned area, and then the film of the scanned area is dissolved in an organic solvent (e.g. methylisobutyl ketone) to develop a latent image formed in the film by scanning. In this way, a positive pattern of the resist is obtained on the substrate.

The resist of the present invention can give a positive pattern with high resolution on a substrate with a radiation such as an electron beam of the acceleration voltage of 25 kV and the dose of $10^{-6}$ Coulomb/cm$^2$ or $10^{-5}$ Coulomb/cm$^2$.

Examples of forming a positive pattern on a substrate by using the copolymers and the cross-linking agents as prepared above are shown below:

EXAMPLE 1

Copolymer A and cross-linking agent E(0,4,0) were mixed to obtain a mixture in which the ratio of the number of epoxy groups of the cross-linking agent to the number of carboxylic acid groups of the copolymer

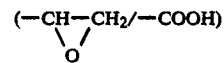

is 1:1. 2 g of the mixture was dissolved in 20 cc of methyl cellosolve acetate. The solution thus obtained was filtered with a Teflon filter having pores of 0.2$\mu$ to remove insoluble matter.

The filtrate was applied on a silicon substrate by means of a spinner at 3,000rpm (revolutions per minute) for 25 seconds and dried off to form a film in a thickness of 0.5$\mu$ on the substrate. The film was heated at a temperature of 150° C. for 40 minutes to establish the cross-linked structure of the copolymer with the cross-linking agent. The film thus treated was dissolved in methylisobutyl ketone to measure the solubility rate of the film. The solubility rate was 20 Å/minute. (On the contrary, the solubility rate of the film not heat-treated was 4,000 Å/min.) The film treated above was scanned with an electron beam with an interval of 1$\mu$ and a line width of 0.25$\mu$. In this scanning, the acceleration voltage was 25 kV and the dose was $1 \times 10^{-5}$ Coulomb/cm$^2$. After the film has been scanned, the latent image formed in the film was developed with methylisobutyl ketone at 25° C. to dissolve the film in the scanned area, and the film in the scanned area was thoroughly removed over 5 minutes. In this way, the latent image formed in the film by scanning can be developed to form a positive pattern on the substrate.

EXAMPLES 2-9

Films and positive patterns were formed on silicon substrates by repeating the same procedure as that of Example 1 in the particulars as shown in the table below:

| No. | Co-polymer | Cross-linking agent | Ratio* | Heat-treatment (°C., minutes) | Dose (Coulomb/cm²) |
|---|---|---|---|---|---|
| 2 | A | E(0,4,0) | 0.1:1 | 150° C., 40min. | $4 \times 10^{-6}$ |
| 3 | A | E(2,4,2) | 1:1 | " | $4 \times 10^{-6}$ |
| 4 | A | P(0,4,0) | 1:1 | " | $1 \times 10^{-5}$ |
| 5 | A | Mixture (1:1) of E(0,4,0) and P(0,4,0) | 1:1 | " | $1 \times 10^{-5}$ |
| 6 | A | Mixture (1:1) of E(0,4,0) and E(1,4,1) | 1:1 | " | $1 \times 10^{-5}$ |
| 7 | B | E(0,4,0) | 3:1 | 150° C., 80min. | $8 \times 10^{-6}$ |
| 8 | A | E(0,2,0) | 1:1 | 150° C., 40min. | $5 \times 10^{-5}$ |
| 9 | A | P(0,7,0) | 1:1 | " | $2 \times 10^{-5}$ |
| 10 | A | E(0,4,0) | 1:1 | " | $1 \times 10^{-5}$ |

*"Ratio" represents the ratio of the number of epoxy groups of the cross-linking agent to the number of carboxylic acid groups of the copolymer.

In the above Examples 2 to 9, the resolutions are as follows:

| No. | Resolution | Reduction of thickness of the film not scanned |
|---|---|---|
| 2 | <0.5μ | 20% |
| 3 | 0.3μ | |
| 4 | 0.5μ | |
| 5 | 0.5μ | |
| 6 | 0.5μ | |
| 7 | 0.5μ | |
| 8 | 0.3μ | |
| 9 | 0.8μ | 30% |
| 10 | 0.1μ | |

As can be seen from the results as shown above, the resists of the present invention have high sensitivity and can produce a positive pattern with high resolution.

The film of the resist having a pattern formed shows a clear square cross section, because the film in the scanned area has a very high solubility in an organic solvent compared with the film in the area not scanned.

The resist of the present invention is especially useful for forming a positive pattern on a substrate in the manufacture of integrated circuits, semiconductor elements and the like.

We claim:

1. A process for forming a positive pattern with a radiation comprising the steps of:
   (1) applying on a substrate a resist comprising a copolymer composed of 100 moles of methyl methacrylate and 1 to 15 moles of methacrylic acid and a cross-linking agent having the following general formula:

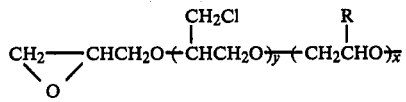

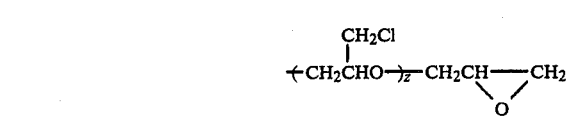

wherein R is H or CH₃, x is an integer of 1 to 9, and y and z are zero, or an integer of 1, 2 or 3,
   (2) cross-linking the copolymer with the cross-linking agent by heating,
   (3) irradiating the desired area with a radiation and then
   (4) developing the latent image formed in the resist with the radiation with an organic solvent.

2. A process according to claim 1 wherein the cross-linking of the copolymer with the cross-linking agent is carried out at a temperature of 100° to 170° C.

UNITED STATES PATENT AND TRADEMARK OFFICE
CERTIFICATE OF CORRECTION

PATENT NO. : 4,346,163

DATED : August 24, 1982

INVENTOR(S) : Kenichi Takeyama, et al

It is certified that error appears in the above—identified patent and that said Letters Patent is hereby corrected as shown below:

Column 2, after line 29 insert --(cross-linking agent prepared from polypropylene glycol)--

Signed and Sealed this

Fifteenth Day of March 1983

[SEAL]

Attest:

GERALD J. MOSSINGHOFF

Attesting Officer     Commissioner of Patents and Trademarks